United States Patent

[11] 3,573,503

[72] Inventor Frank G. Macey
Shrewsbury, Mass.
[21] Appl. No. 795,548
[22] Filed Jan. 31, 1969
[45] Patented Apr. 6, 1971
[73] Assignee Sylvania Electric Products Inc.

[54] PULSE GENERATING CIRCUIT
6 Claims, 1 Drawing Fig.

[52] U.S. Cl. .......... 307/264, 307/267, 307/290
[51] Int. Cl. .......... H03k 3/295
[50] Field of Search .......... 307/264, 268, 237, 267, 290

[56] References Cited
UNITED STATES PATENTS

| | | | |
|---|---|---|---|
| 2,986,650 | 5/1961 | Wolfendale .......... | 307/290 |
| 3,125,694 | 3/1964 | Palthe .......... | 307/237 |
| 3,320,436 | 5/1967 | Sharples .......... | 307/237 |
| 3,305,729 | 2/1967 | Stein .......... | 307/237 |
| 3,324,309 | 6/1967 | Zeller .......... | 307/290 |

*Primary Examiner*—John S. Heyman
*Assistant Examiner*—Harold A. Dixon
*Attorneys*—Norman J. O'Malley, Elmer J. Nealon and Peter Xiarhos

ABSTRACT: A regenerative pulse-generating circuit having hysteresis for producing a train of constant amplitude, varying width output pulses having fast rise and fall times from a train of low level, varying amplitude analog input pulses. Each analog input pulse is applied to an input switching transistor which, during the quiescent mode of operation of the pulse generating circuit, is biased in its saturation region. When the voltage level of the input pulse reaches an upper threshold voltage level of the pulse-generating circuit, the input switching transistor starts to rapidly turn off and causes the voltage at the base of an emitter-follower output transistor coupled thereto to rapidly change. When this voltage reaches a predetermined value, it is clamped to that value by means of a diode. The emitter-follower output transistor, which is biased in a low conduction state during the quiescent mode of operation of the pulse-generating circuit, is operated in a high conduction state and the voltage level at the emitter thereof changes from its quiescent value.

When the voltage level of the input pulse reaches a lower threshold voltage level of the pulse-generating circuit, the input switching transistor and the output transistor are switched to their quiescent operating states whereby the voltage level at the emitter of the output transistor returns to its original value. Because of the presence of regeneration between the transistors, the transistors are switched from one state to another in a very rapid fashion.

Patented April 6, 1971 3,573,503
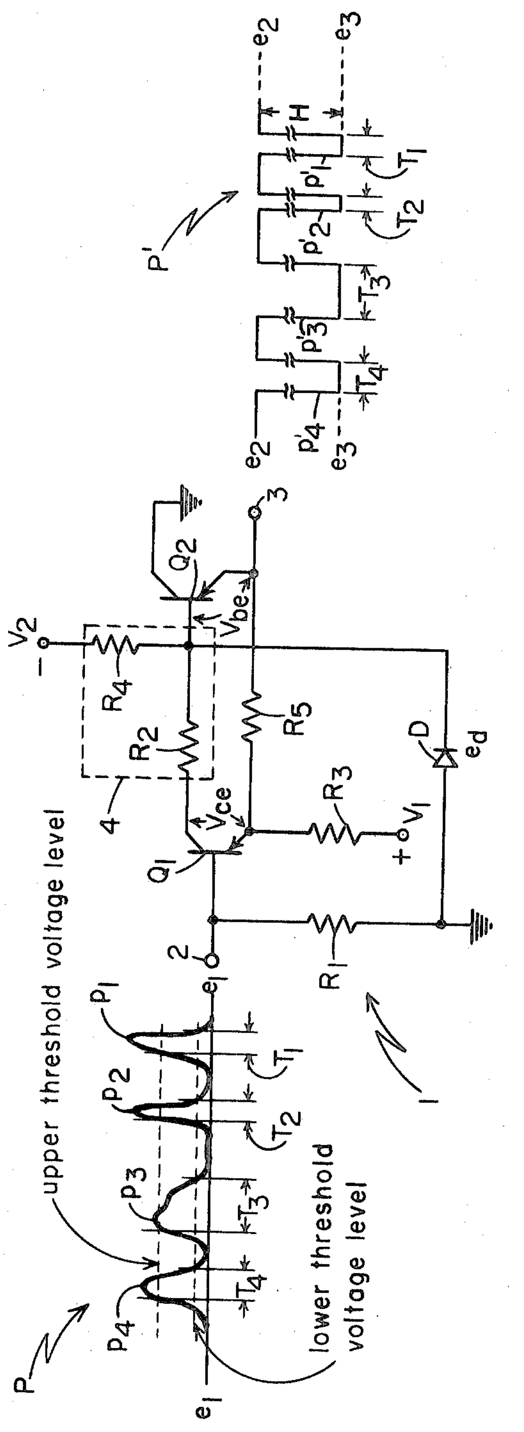
INVENTOR.
FRANK G. MACEY
BY Peter Xiarhos
AGENT.

PULSE GENERATING CIRCUIT

BACKGROUND OF THE INVENTION

The present invention relates to pulse-generating circuits. More particularly, it is concerned with a regenerative pulse-generating circuit having hysteresis for producing a train of constant amplitude, varying width output pulses having fast rise and fall times from a train of varying amplitude, low level analog input pulses.

There are many circuit applications in which it is desirable to perform certain operations using the leading and trailing edges of pulses. To insure that these operations are performed in a satisfactory manner, it is generally required that the pulses be well defined and have fast rise and fall times. A variety of commercially available circuits are known for generating well-defined pulses having fast rise and fall times. These circuits include regenerative circuits such as bistable and monostable multivibrator circuits, and regenerative circuits having hysteresis such as schmitt trigger circuits and differential comparator circuits.

While each of the above-mentioned circuits is capable of producing well-defined pulses having fast rise and fall times, each has certain limitations which restrict its usefulness in many circuit applications. For example, commercially available bistable and monostable multivibrator circuits require sharp, well-defined input triggering pulses having a minimum amplitude of approximately 1 volt. Thus, where it is desired to produce output pulses having fast rise and fall times from input triggering signals of an analog nature, or input signals of less than 1 volt amplitude, such bistable and monostable multivibrator circuits are generally unsuitable. Additionally, monostable multivibrator circuits are arranged to produce constant width output pulses regardless of the widths of the corresponding input triggering pulses; hence, they are unsuitable where it is desired to produce output pulses having varying widths in response to input pulses of varying widths.

Commercially available schmitt trigger circuits, while capable of producing output pulses having fast rise and fall times from analog input triggering pulses, also require, as in the case of commercial bistable and monostable multivibrator circuits, that the analog input triggering pulses have a minimum amplitude of approximately 1 volt. Commercially available differential comparator circuits, while capable of operation with analog input signals having an amplitude of less than 1 volt, do not have a current drive sufficient to operate several output circuits having their input connections connected in parallel to the output connection of a differential comparator circuit, and do not have a high current-sinking capability (the capability of driving a large output load to ground potential from some positive or negative potential).

BRIEF SUMMARY OF THE INVENTION

Briefly, in accordance with the present invention, a pulse generating circuit is provided which is capable of producing constant amplitude, varying width output pulses having fast rise and fall times from low level, varying amplitude analog input pulses, the analog input pulses having typical amplitude values of from 100 millivolts to 6 volts. Additionally, the pulse generating circuit of the present invention has the capability of driving several output circuits and of driving a large output load to ground potential from some value differing from ground potential.

In accordance with the present invention, a first circuit means is provided which has a first operating condition and a second operating condition. First and second input conditions, for example, first and second voltage levels of an analog input pulse, are applied to an input connection to the first circuit means. In response to the first input condition at the input connection of the first circuit means, the first circuit means operates to switch from the first operating condition to the second operating condition and, in response to the second input condition, to switch from the second operating condition to the first operating condition. By way of example, the first input condition may be a first voltage value of the analog input pulse which is equal to an upper threshold voltage level of the pulse-generating circuit, and the second input condition may be a second voltage value of the analog input pulse which is equal to a lower threshold voltage level of the pulse-generating circuit.

A second circuit means is also provided which has first and second operating conditions. During the first operating condition, a first output voltage level is produced at an output connection thereof which differs by a predetermined fixed amount from the value of a corresponding first voltage level at an input connection thereof. During the second operating condition, a second output voltage level is produced at the output connection thereof which differs by the predetermined fixed amount from the value of a corresponding second voltage level at the input connection thereof. The first and second voltage levels at the input connection of the second circuit means are provided by third and fourth circuit means, respectively, to be briefly described below.

To insure rapid switching between the two operating conditions of the first and second circuit means, a regenerative feedback means is provided which couples the first and second circuit means. More particularly, the regenerative feedback means operates to provide regenerative action between the first and second circuit means to cause the first and second circuit means to rapidly switch from their respective first operating conditions to their respective second operating conditions in response to the presence of the first input condition at the input connection of the first circuit means. The regenerative action provided by the regenerative feedback means also causes the first and second circuit means to rapidly switch from their respective second operating conditions to their respective first operating conditions in response to the presence of the second input condition at the input connection of the first circuit means.

The aforementioned first and second voltage levels at the input connection of the second circuit means are provided by third and fourth circuit means. The third circuit means is operable to provide a first voltage level at the input connection of the second circuit means when the first circuit means is in the first operating condition, and the fourth circuit means is operable to provide a second input voltage level at the input connection of the second circuit means when the first circuit means is in the second operating condition. In response to the first voltage level, the second circuit means operates in the first operating condition and produces a first output voltage level at the output connection thereof which differs by the aforementioned predetermined fixed amount from the value of the first input voltage level. In response to the second input voltage level, the second circuit means operates in the second operating condition and produces a second output voltage level at the output connection thereof which differs by the predetermined fixed amount from the value of the second input voltage level.

BRIEF DESCRIPTION OF THE DRAWING

The single FIGURE illustrates in detailed schematic diagram form a regenerative, hysteresis pulse-generating circuit in accordance with the present invention.

GENERAL DESCRIPTION

Referring to the FIGURE, there is shown a regenerative pulse-generating circuit 1 having hysteresis in accordance with the present invention. As shown in the FIGURE, an input terminal 2 is provided for receiving a train P of low level, positive-going, varying amplitude analog input pulses. In response to the train P of analog input pulses, the pulse-generating circuit 1 operates, in accordance with the present invention, to provide at an output terminal 3 a corresponding train P′ of constant amplitude, negative-going, varying width output pulses having fast rise and fall times.

The input terminal 2 is directly connected to the base electrode of a PNP input switching transistor $Q_1$. The base electrode of the input switching transistor $Q_1$ is coupled to ground potential through a biasing resistor $R_1$. The collector electrode of the input switching transistor Q, is coupled to the base electrode of a PNP output transistor $Q_2$ through a resistor $R_2$, and the emitter electrode is coupled to a source of positive potential $V_1$ through a resistor $R_3$.

The base electrode of the output transistor $Q_2$ is connected to a source of negative potential $V_2$ through a resistor $R_r$ and to the cathode electrode of a clamping diode D, the anode electrode of the clamping diode D being directly connected to ground potential. The collector electrode of the output transistor $Q_2$ is directly connected to ground potential, and the emitter electrode is connected to the output terminal 3 and also to the emitter electrode of the input switching transistor $Q_1$ through a feedback resistor $R_5$.

As is apparent from the FIGURE, the resistors $R_2$ and $R_4$ form a voltage divider circuit 4 which, as will become apparent hereinafter, establishes the base voltage at the base electrode of the output transistor $Q_2$ during the conducting condition of the input switching transistor $Q_1$. As also shown in the FIGURE, the output transistor $Q_2$ is arranged in an emitter-follower configuration, the voltage at the emitter electrode of the output transistor $Q_2$ and, hence, at the output terminal 3, following the voltage at the base electrode of the output transistor $Q_2$.

QUIESCENT OPERATION OF THE PULSE-GENERATING CIRCUIT

In the quiescent operating condition of the pulse-generating circuit 1, that is, with no analog pulse $p$ present at the input terminal 2, the input terminal 2 is at a quiescent voltage level $e_1$. During this condition, the source of positive potential $V_1$ and the resistor $R_3$ establish a positive voltage at the emitter electrode of the input switching transistor $Q_1$, and the biasing resistor $R_1$ establishes a voltage at the base electrode which is sufficiently negative with respect to the voltage at the emitter electrode to forward bias the base-emitter junction of the input switching transistor $Q_1$. Since the base-emitter junction of the input switching transistor $Q_1$ is forward biased, the input switching transistor $Q_1$ operates in its conducting condition. The values of the biasing resistor $R_1$, the resistor $R_3$, and the source of positive potential $V_1$ are selected to establish a base current drive which is sufficient to cause the input switching transistor $Q_1$ to operate in its saturation region.

While the input switching transistor $Q_1$ is in its saturation conducting condition, current flows from the source of positive potential $V_1$ through the resistor $R_3$, the emitter-collector circuits of the conducting input switching transistor $Q_1$, the voltage divider resistors $R_2$ and $R_4$, to the source of negative potential $V_2$. This current flow establishes a positive voltage at the juncture of the voltage divider resistors $R_2$ and $R_4$ which is applied directly to the base electrode of the PNP output transistor $Q_2$.

The positive voltage at the base electrode of the output transistor $Q_2$ is sufficiently negative with respect to the emitter electrode of the output transistor $Q_2$ (which is also at a positive voltage due to the source of positive potential $V_1$ and the resistors $R_3$ and $R_5$) to forward bias the base-emitter junction of the output transistor $Q_2$. With the base-emitter junction of the output transistor $Q_2$ forward biased, the output transistor $Q_2$ operates in its conducting condition. The values of the source of positive potential $V_1$ and the resistors $R_3$ and $R_5$ are selected to cause the output transistor $Q_2$ to be biased fully in the conducting condition. Since the output transistor $Q_2$ is arranged in an emitter-follower configuration, the voltage at the emitter electrode of the output transistor $Q_2$ and, hence, at the output terminal 3, follows the voltage at the base electrode, and has a quiescent value of $e_2$ volts as indicated in the output waveform in the FIGURE.

The value of the voltage $e_2$ at the emitter electrode of the output transistor $Q_2$ and thus at the output terminal 3 during the conducting condition of the transistors $Q_1$ and $Q_2$ is equal to the value of the voltage at the base electrode of the output transistor $Q_2$ with respect to ground potential, $^{e}b(Q_2), 2)$, less the voltage drop across the base-emitter electrodes of the output transistor $Q_2$, $V_{be(Q_2)}$. This voltage $e_2$ may be given by $$e_2 = v_1 - V_{ce(Q_1)} - \left[\frac{(R_2+R_3)(V_1-V_2)}{(R_2+R_3+R_4)}\right] + V_{be(Q_2)}$$

where $V_{ce(Q_1)}$ is the voltage drop across the collector and emitter electrodes of the saturated input switching transistor $Q_1$. Typical values for $V_{ce(Q_1)}$ and $V_{be(Q_2)}$ are −0.2 volts and −0.7 volts, respectively. In a typical application of the pulse-generating circuit 1, the values of the parameters in the above-mentioned expression for $e_2$ are selected to provide a value for $e_2$ of approximately +4.7 volts, a voltage level compatible with many types of digital integrated circuits, for example.

In addition to the above-mentioned current flow through the conducting input switching transistor $Q_1$ to the base electrode of the output transistor $Q_2$, two other current paths are provided to the output transistor $Q_2$. In a first path, current flows from the source of positive potential $V_1$ through the resistors $R_3$ and $R_5$, the emitter-collector circuits of the output transistor $Q_2$, to ground potential. In a second path, current flows through the emitter-base circuits of the output transistor $Q_2$, the voltage divider resistor $R_4$, to the source of negative potential $V_2$. The values of the parameters of each of the components in the above-mentioned current paths are selected to cause the output transistor $Q_2$ to operate in its linear region, that is, in its low conduction condition.

In the quiescent operating condition of the pulse-generating circuit 1, current also attempts to flow from ground potential to the source of negative potential $V_2$ through the clamping diode D and the voltage divider resistor $R_4$. However, since the voltage at the base electrode is of the output transistor $Q_2$ is at a positive value as previously stated (although negative with respect to the voltage at the emitter electrode), the clamping diode D is reverse biased and, hence, there is no current flow therethrough to have any effect on the voltage at the base electrode of the output transistor $Q_2$.

The operation of the pulse generating circuit 1 to produce the train P′ of constant amplitude, negative-going, varying width output pulses having fast rise and fall times in response to the train P of low level, positive-going, varying amplitude analog input pulses will now be described.

UPPER THRESHOLD TRIGGERING OPERATION

As shown in the FIGURE, the train P of analog input pulses comprises a plurality of positive-going analog pulses $p$ having varying amplitudes. For the purpose of the present description of the triggering operation of the pulse-generating circuit 1, the analog input pulse designated in the FIGURE as $p_1$ will be considered. However, the same mode of operation occurs for the other illustrated pulses $p_2$ through $p_4$.

As the analog input pulse $p_1$ increases in value in a positive direction from the quiescent voltage level $e_1$, no change in the quiescent operation of the pulse generating circuit 1 occurs until a voltage level is reached at which the input switching transistor $Q_1$ is caused to come out of saturation. At this voltage level, which is designated the "upper threshold voltage level" of the pulse generating circuit 1, current flow through the input switching transistor $Q_1$ decreases. The value of the upper threshold voltage level of the pulse generating circuit 1 at which the above action occurs is determined from the values of the resistors $R_1$ and $R_3$ and the source of positive potential $V_1$ which establish the biasing conditions for the input switching transistor $Q_1$.

As the the input switching transistor $Q_1$ starts to operate in its nonconducting condition (i.e., to come out of saturation), the voltage at the juncture of the voltage divider resistors $R_2$ and $R_4$ and, thus, at the base electrode of the output transistor $Q_2$; starts to increase (become more negative) and to approach the value of the source of negative potential $V_2$. Since the voltage at the base electrode of the output transistor $Q_2$ becomes more negative, and since the voltage at the emitter electrode also becomes more negative (increased forward bias), the current flow through the output transistor $Q_2$ increases. The increased current flow which occurs in the emitter circuit of the output transistor $Q_2$ also flows through the resistor $R_3$ and the feedback resistor $R_5$ from the source of negative potential $V_2$. The voltage at the emitter electrode of the input switching transistor $Q_1$ thus becomes more negative, further reducing the forward bias of the input switching transistor $Q_1$ and further decreasing collector-circuit current.

The above action is regenerative, and once started, proceeds in a very rapid manner and continues until the input switching transistor $Q_1$ becomes nonconducting and the output transistor $Q_2$ operates in a high conduction condition, that is, a condition of high current flow relative to its previous low conduction condition. With no current flow through the input switching transistor $Q_1$; current flows from ground potential through the clamping diode D and the voltage divider resistor $R_4$ to the source of negative potential $V_2$. The voltage at the base electrode of the output transistor $Q_2$ is thus clamped to the value of the voltage drop across the clamping diode D, typically −0.7 volts.

When the voltage at the base electrode of the output transistor $Q_2$ is clamped to the value of the voltage drop $e_d$ across the conducting clamping diode D, the value of the voltage at the emitter electrode of the emitter-follower output transistor $Q_2$ (which follows the voltage at the base electrode) and, hence, at the output terminal 3, is given by $$e_3 = _d + V_{be(Q_2)}$$

For the previously stated typical values of $e_d$=—volts (with respect to ground potential) and $V_{be(Q_2)}$=+0.7 volts, $e_3$ has a value of 0 volts. Thus, for the previously stated typical value of $e_2$=+4.7 volts, the output voltage swing of the pulse generating circuit is 0 to 4.7 volts, a satisfactory range for operating many types of digital integrated circuits.

LOWER THRESHOLD TRIGGERING OPERATION

The above-described operating condition of the pulse generating circuit 1 during which the output voltage level thereof is at $e_3$ volts continues until the value of the input pulse $p_1$ decreases to a voltage level at which the input switching transistor $Q_1$ is caused to start to operate again in its conducting condition. The value of this voltage level, which is designated the "lower threshold voltage level" of the pulse-generating circuit 1, is determined from the values of the resistors $R_3$ and $R_5$ and the source of positive potential $V_1$ which establish the biasing conditions for the input switching transistor $Q_1$ during the lower threshold triggering operation of the pulse-generating circuit 1.

When the value of the analog input pulse $p_1$ decreases to the lower threshold voltage level of the pulse-generating circuit 1, the forward biasing of the input switching transistor $Q_1$ increases, current flow through the input switching transistor $Q_1$ increases, and the voltage at the base electrode of the output transistor $Q_2$ decreases (becomes more positive). As a result of the decrease in the voltage at the base electrode of the output transistor $Q_2$, the forward biasing of the output transistor $Q_2$ decreases, and current flow through the output transistor $Q_2$ decreases. The voltage at the emitter electrode of the input switching transistor $Q_1$ thus becomes more positive, further increasing the forward bias of the input switching transistor $Q_1$ and further increasing collector-circuit current. The above action is regenerative, and once started, proceeds in a very rapid manner and continues until the input switching transistor $Q_1$ again operates in its saturation region (quiescent operating condition) and the output transistor $Q_2$ again operates in its low conduction condition (quiescent operation condition). With the transistors $Q_1$ and $Q_2$ in their respective conducting conditions, the output voltage level at the output terminal 3 is again at $e_2$ volts.

In the FIGURE, the negative-going output pulse $p'_1$ corresponds to the positive-going analog input pulse $p_1$ and has an amplitude equal to $H = e_3 - _2$ volts and a width $T_1$ equal to the time occurring between the upper and lower threshold triggering operations of the pulse-generating circuit 1 due to the input pulse $p_1$. In the FIGURE, the output pulses $p'_2$—$_4$ correspond to the analog input pulses $p_2$—$p_4$.

It is to be noted that although the input switching transistor $Q_1$ has both a fully conducting condition and a fully nonconducting condition, the output transistor $Q_2$ is always in a conducting condition (low conduction condition and high conduction condition). This situation exists principally because of ever-present current flow through the emitter-collector circuits of the output transistor $Q_2$ due to the source of positive potential $V_1$ and the resistors $R_3$ and $R_5$. In addition, a small amount of base circuit current also exists due to the source of negative potential $V_2$ and the voltage divider resistor $R_4$. Thus, the voltage at the base electrode of the output transistor $Q_2$ is always at some negative value relative to the voltage at the emitter electrode.

Some typical values for the parameters of the components of the pulse-generating circuit 1 which have been employed to generate constant amplitude output pulses having a voltage swing of 0 to +4.7 volts and fast rise and fall time from analog input pulses of 100 millivolts to 6 volts are given below.

| | |
|---|---|
| $V_1$ | +10 volts |
| $V_2$ | −6 volts |
| $e_1$ | +8.3 volts |
| $e_2$ | +4.7 volts |
| $e_3$ | 0 volts |
| $Q_1$ | 2N3640 |
| $Q_2$ | 2N3640 |
| D | 1N4148 (0.7 volts) |
| $R_1$ | 20 kilohms |
| $R_2$ | 2 kilohms |
| $R_3$ | 200 ohms |
| $R_4$ | 3.9 kilohms |
| $R_5$ | 1.5 kilohms |
| Upper threshold voltage level | approx. 75 millivolts |
| Lower threshold voltage level | approx. 25 millivolts |

MODIFICATIONS

Although not specifically discussed hereinabove, it is to be appreciated that an input pulse $p$ having an amplitude less than the upper threshold voltage level of the pulse-generating circuit 1 is ignored by the pulse-generating circuit. Thus, if desired, the pulse-generating circuit 1 may be used to provide amplitude discrimination. The pulse-generating circuit 1 may also be used in many circuit applications where schmitt trigger circuits might customarily be used or, alternatively, as a sense amplifier circuit. Additionally, the pulse-generating circuit 1 may be embodied in the form of an integrated circuit, particularly if NPN transistors are employed instead of the disclosed PNP transistors. Other modifications and variations will be readily apparent to those skilled in the art without departing from the invention disclosed hereinabove.

I claim:

1. A pulse-generating circuit comprising:

first circuit means having a first operating condition and a second operating condition;

an input connection to the first circuit means;

said first circuit means being operable to switch from the first operating condition to the second operating condition in response to a first input condition at the input connection and being operable to switch from the second operating condition to the first operating condition in response to a second input condition at the input connection;

second circuit means having an input connection and an output connection, said second circuit means having first and second operating conditions during which first and second output voltage levels, respectively, are produced at the output connection thereof each having a value less than the value of the corresponding input voltage level at the input connection thereof by a predetermined fixed value of voltage;

regenerative feedback means coupling the first and second circuit means for providing regenerative action between the first and second circuit means to cause the first circuit means to rapidly switch from the first operating condition to the second operating condition and the second circuit means to rapidly switch from the first operating condition to the second operating condition in response to the presence of the first input condition at the input connection of the first circuit means, and to cause the first circuit means to rapidly switch from the second operating condition to the first operating condition and the second circuit means to rapidly switch from the second operating condition to the first operating condition in response to the presence of the second input condition at the input connection of the first circuit means;

third circuit means connected to the input connection of the second circuit means and operable to provide a first input voltage level at the input connection of the second circuit means when the first circuit means is in the first operating condition whereby the second circuit means operates in the first operating condition and produces a first output voltage level at the output connection thereof which has a value less than the value of the first input voltage level by the predetermined fixed value of voltage; and fourth circuit means connected to the input connection of the second circuit means and operable to provide a second input voltage level at the input connection of the second circuit means having a value equal to the predetermined fixed value of voltage when the first circuit means is in the second operating condition whereby the second circuit means operates in the second operating condition and produces a second output voltage level at the output connection thereof having a value less than the value of the second input voltage level by the predetermined fixed value of voltage.

2. A pulse-generating circuit in accordance with claim 1 wherein:

the first operating condition of the first circuit means is a conduction condition and the second operating condition of the first circuit means is a nonconduction condition; and the first operating condition of the second circuit means is a low conduction condition and the second operating condition of the second circuit means is a high conduction condition.

3. A pulse-generating circuit in accordance with claim 1 wherein:

the first circuit means includes a first source of potential, a first transistor having a first electrode connected to the input connection, a second electrode, and a third electrode; and the second circuit means includes a second transistor having a first electrode, a second electrode connected to the first source of potential, and a third electrode connected to the output connection; and including:

a first resistance connected to the first electrode of the first transistor and to the first source of potential;

a second resistance connected to the second electrode of the first transistor and to the first electrode of the second transistor;

a second source of potential;

a third resistance connected to the third electrode of the first transistor and to the second source of potential;

a third source of potential;

a fourth resistance connected to the juncture of the second resistance and the first electrode of the second transistor and to the third source of potential;

a fifth resistance connected to the third electrode of the first transistor and to the third electrode of the second transistor; and a diode having a first electrode connected to the first source of potential and a second electrode connected to the juncture of the second resistance, the fourth resistance, and the first electrode of the second transistor.

4. A pulse-generating circuit in accordance with claim 3 wherein the first, second, and third electrodes of the first and second transistors are base, collector, and emitter electrodes, respectively.

5. A pulse-generating circuit a in accordance with claim 4 wherein:

the first input condition at the input connection of the first circuit means is a first voltage level and the second input condition at the input connection of the first circuit means is a second voltage level;

the values of the parameters of the components of the pulse generating circuit are selected to cause the first transistor to operate in a nonconduction state and the second transistor to operate in a high conduction state in response to the presence of the first voltage level at the input connection of the first circuit means, and to cause the first transistor to operate in its saturation region and the second transistor to operate in a low conduction state in response to the presence of the second voltage level at the input connection of the first circuit means; and the value of the first voltage level being established by the values selected for the first resistance, the third resistance, and the second source of potential; and the value of the second voltage level being established by the values selected for the third resistance, the fifth resistance, and the second source of potential.

6. A pulse-generating circuit in accordance with claim 5 wherein:

the first and second transistors are of the PNP type;

the first source of potential is ground potential;

the second source of potential is a source of positive potential;

the third source of potential is a source of negative potential; and the first electrode of the diode is the anode electrode and the second electrode of the diode is the cathode electrode.